United States Patent [19]
Sloate et al.

[11] 3,952,188
[45] Apr. 20, 1976

[54] MONOLITHIC TRANSVERSAL FILTER WITH CHARGE TRANSFER DELAY LINE

[75] Inventors: Harry M. Sloate, Acton; Arthur M. Cappon, Boston, both of Mass.

[73] Assignee: Sperry Rand Corporation, New York, N.Y.

[22] Filed: Mar. 24, 1975

[21] Appl. No.: 561,568

[52] U.S. Cl............................. 235/193; 307/221 D; 328/167; 333/18
[51] Int. Cl.²...................................... H03K 5/159
[58] Field of Search.................... 235/193; 328/167; 333/18, 28, 70 T; 307/221 C, 221 D; 357/24

[56] References Cited
UNITED STATES PATENTS

| | | | |
|---|---|---|---|
| 3,546,490 | 12/1970 | Sangster.................. | 307/221 D UX |
| 3,809,923 | 5/1974 | Esser.................................. | 333/18 X |
| 3,824,337 | 7/1974 | Sangster et al. ............ | 307/221 D X |
| 3,824,413 | 7/1974 | Awipi et al. ................ | 307/221 D X |
| 3,868,516 | 2/1975 | Buss.............................. | 333/70 T X |

OTHER PUBLICATIONS

Puckette et al., "Bucket-Brigade Transversal Filters," IEEE Transactions on Circuits and Systems, Vol. CAS-21, No. 4, pp. 502–510, July, 1974.

*Primary Examiner*—Joseph F. Ruggiero
*Attorney, Agent, or Firm*—Howard P. Terry

[57] ABSTRACT

A transversal filter which utilizes a charge transfer delay line in combination with a plurality of source-follower pairs or their equivalent to tap the delay line and a plurality of transistors fabricated and disposed to proportionately weight, polarize, error-compensate and differentially sum the tapped signals in a single operation.

8 Claims, 3 Drawing Figures

MONOLITHIC TRANSVERSAL FILTER WITH CHARGE TRANSFER DELAY LINE

BACKGROUND OF THE INVENTION

1. Field of the Invention

The invention relates to information storage devices and more particularly to a monolithic device for the sequential charge transfer of a signal which is tapped and filtered in accordance with a predetermined function.

2. Description of the Prior Art

Monolithic transversal filters utilizing charge transfer circuits have developed rapidly in recent years. From the outset, it was apparent that the tapped outputs along the delay line had to be weighted on the chip itself, since individual lead outs for the various taps consumed a substantial amount of space. Various methods for on-chip weighting have been developed such as the split electrode technique, the weighted capacitor technique, the weighted transconductance technique, etc. as described by Puckette et al, in an article entitled "Bucket Brigade Transversal Filters", IEEE Transactions on Communications, Vol. COM-22, No. 7, July 1974, pages 926–934, inclusive. As indicated in that article, all of these methods require that the positive weights and negative weights be grouped separately and differentially summed to give the appropriate output.

The present invention, then is a monolithic transversal filter which incorporates all of the necessary functions, including differential summing, in a minimal amount of chip space, and which in addition thereto, can be economically fabricated.

SUMMARY OF THE INVENTION

The invention comprises a transversal filter in which a plurality of amplifier elements, such as MOSFETS, are utilized to proportionately amplify, error-compensate, polarize and differentially sum the tapped outputs of a device such as a charge transfer delay line. Specifically, the transconductance of each amplifier outlet is varied in fabrication to yield the desired amplification and error-compensation factor. Additionally, the amplifiers are arranged in two groups according to polarity. By coupling a loading device, such as a MOSFET, to each group of amplifier elements and additionally coupling a constant source element, such as an appropriately fabricated MOSFET, to all the amplifier elements, the proportionately amplified and error-compensated tapped outputs are polarized and differentially summed.

DESCRIPTION OF THE PREFERRED EMBODIMENT

Figure 1:
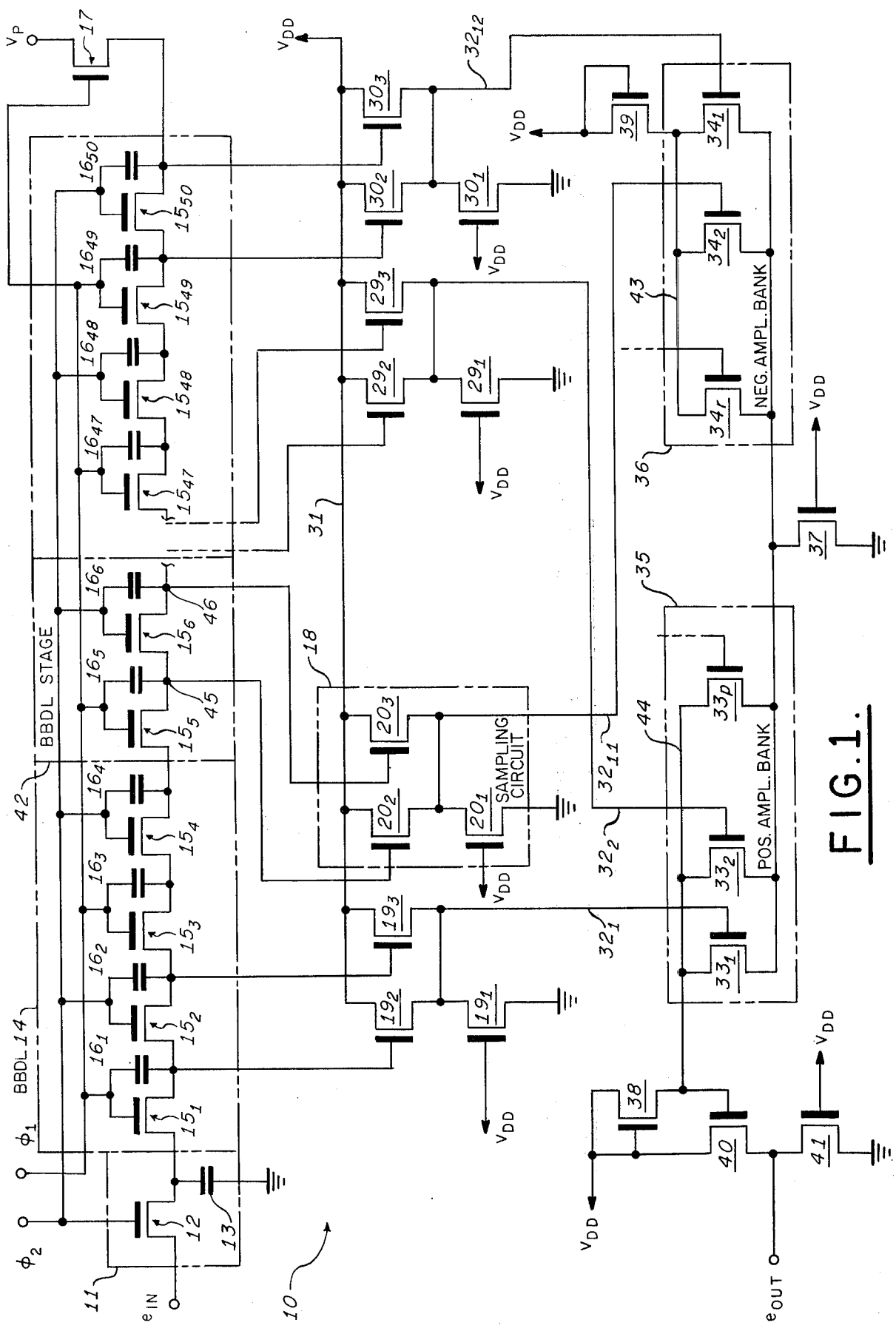
FIG. 1 is a schematic diagram depicting the circuitry which comprises the invention.

FIG. 1 depicts the circuitry of the present invention. An initial charge transfer device 11 is comprised of a transistor 12 and a capacitor 13. The source electrode of transistor 12 is connected to an input terminal $e_{in}$ and the drain electrode is connected to a grounded capacitor 13. A junction between the drain electrode of transistor 12 and capacitor 13 is coupled to the input of a Bucket Brigade Delay Line 14 and more particularly to the source electrode of a transistor $15_1$. The bucket brigade delay line (BBDL) includes the serial connection of a plurality of transistors $15_1$, $15_2$ . . . $15_{50}$ in which, the drain electrode of transistor $15_1$ is coupled to the source electrode of transistor $15_2$, the drain electrode of transistor $15_2$ is connected to the source electrode of transistor $15_3$, etc. The BBDL 14 also includes a plurality of capacitors $16_1$, $16_2$ . . . $16_{50}$ connected between thhe gate and drain electrodes of the associated transistors. For example, capacitor $16_1$ is connected between the gate and drain electrodes of transistor $15_1$, capacitor $16_2$ is connected between the gate and drain electrodes of transistor $15_2$, etc. The junctions between the capacitors and the gate electrodes are alternately connected to a two-phase power source via leads $\phi_1$ and $\phi_2$. For example, the junctions of capacitor $16_1$ and the gate of transistor $15_1$, capacitor $16_3$ and the gate of transistor $15_3$, etc. are coupled to lead $\phi_1$ whereas the junctions of capacitor $16_2$ and the gate of transistor $15_2$, capacitor $16_4$ and the gate of transistor $15_4$, etc. are connected to lead $\phi_2$. The drain electrode of transistor $15_{50}$ is coupled to the source electrode of transistor 17. The gate electrode of transistor 17 is connected to $\phi_1$ and the drain electrode is connected to a potential source $V_p$.

The BBDL 14 is tapped by a plurality of sampling circuits such as sampling circuit 18. Each sampling circuit is composed of three transistors such as $19_1$, $19_2$ and $19_3$ and each is connected in a similar fashion to that of sampling circuit 18. In sampling circuit 18, the drain electrodes of transistors $20_2$ and $20_3$ are connected to a common lead 31 which is coupled to a biasing source $V_{DD}$. The source electrodes of transistors $20_2$ and $20_3$ and the drain electrode of transistor $20_1$ are coupled to an output lead $32_{11}$. The source electrode of the transistor $20_1$ is connected to ground while the gate electrode is coupled to the biasing source $V_{DD}$. The gate electrode of transistor $20_2$ is connected to a junction 45 of the drain electrode of transistor $15_5$ and the source electrode of transistor $15_6$. Similarly, the gate electrode of transistor $20_3$ is connected to an adjacent junction 46 of the drain electrode of transistor $15_6$ and the source electrode of transistor $15_7$ (not shown).

A plurality of output leads $32_1$, $32_2$ . . . $32_{12}$ extending from the sampling circuits are coupled to the gate electrodes of the weighting amplifiers (transistors) $33_1$, $33_2$ . . . $33_p$ and $34_1$, $34_2$ . . . $33_r$. The weighting amplifiers are assembled together according to polarity. For example, weighting amplifiers $33_1$, $33_2$ . . . $33_p$ form the positive bank of amplifiers 35 while weighting amplifiers $34_1$, $34_2$ . . . $34_r$ form the negative bank of weighting amplifiers 36. The source electrodes of all the weighting amplifiers are coupled to the drain electrodes of a transistor 37. The source electrode of transistor 37 is coupled to ground while the gate electrode is connected to the biasing source $V_{DD}$. The drain electrodes of the weighting amplifiers comprising the positive bank 35 are coupled to the source electrode of a transistor 38. Similarly, the drain electrodes of the weighting amplifiers comprising the negative bank 36 are coupled to the source electrode of a transistor 39. The gate and drain electrodes of transistors 38 and 39 are coupled to the biasing source $V_{DD}$. Additionally, the source electrode of transistor 38 is coupled to the gate electrode of transistor 40. The source electrode of transistor 40 is connected to the drain electrode of transistor 41 while the drain electrode of transistor 40 and the gate electrode of transistor 41 are both connected to the biasing source $V_{DD}$. Finally, the source electrode of transistor 41 is coupled to ground while the source electrode of transistor 40 is coupled to an output terminal $e_{out}$.

Initially, it is to be understood that all of the transistors, hereinafter described, should be of the same type, preferably n-channel or p-channel MOSFETS (IG-FETS), so that the invention may be more economically manufactured. Moreover, in a monolithic device, the capacitors depicted in FIG. 1 as discrete components are preferably interelectrode capacitances which result from careful fabrication of the chip.

The BBDL 14 is composed of a plurality of stages similar to stage 42 and in this particular case totalling 25. Each stage consists of two charge transfer devices ("buckets") in which each charge transfer device is composed of a transistor and a capacitor. For example, stage 42 is composed of a first charge transfer device consisting of transistor $15_5$ and capacitor $16_5$ and a second such device consisting of transistor $15_6$ and capacitor $16_6$. In each stage, the gate-capacitor junction of the first charge transfer device is coupled to the $\phi_1$ lead and the gate-capacitor junction of the second device is coupled to the $\phi_2$ lead. The $\phi_1$ and $\phi_2$ leads are connected to a two-phase power supply wherein the potential applied to the $\phi_1$ lead remains 180° out of phase with the potential applied to the $\phi_2$ lead. Transistor 17 in cooperation with the voltage source $V_p$ act as a precharger source supplying charge to the respective charge transfer devices ("filling the buckets") of the BBDL 14. In the manner of conventional BBDLs, the "fullness" of the buckets, corresponding to fully charged charge transfer devices, proceeds from the precharger source toward the input terminal $e_{in}$ while the proportionate "emptiness" of the buckets, corresponding to the input signal (analog information) proceeds from the input terminal $e_{in}$ toward the precharger source. See Sangster et al., "Bucket Brigade Electronics — New Possibilities for Delay, Time-Axis Conversion, and Scanning", IEEE Journal of Solid State Circuits, Vol. SC-4, June 1969, pp. 131–136, inclusive.

The potential voltages on leads $\phi_1$ and $\phi_2$ which cause the transfer of the analog information throughout the BBDL and govern the length of the time delay are negatively polarized for p-channel MOSFET devices and positively polarized for n-channel MOSFET devices. Similarly, the polarity of the precharger source voltage $V_p$ is negative for p-channel MOSFET devices and positive for n-channel MOSFET devices.

In accordance with the Fourier Transform for the filtering function to be performed, various stages, such as stage 42, are designated to be "tapped". The tapping is accomplished by monitoring the level of charge retained by each bucket of a designated stage. Accordingly, the junction 45 of transistor $15_5$ and capacitor $16_5$ and the junction 46 of transistor $15_6$ and capacitor $16_6$ are coupled to sampling circuit 18. The monitoring is performed by the gate electrodes of a pair of transistors $20_2$ and $20_3$ arranged as a source-follower pair. Such an arrangement is preferred for two reasons. Firstly, the high input impedance of the transistor permits the "buckets" to be non-destructively tapped, that is, monitored without the loss of charge from the "bucket" to the sampling circuit. Secondly, the combination of the source-followers in groups equal to the number of charge transfer devices in a stage, (in this case, pairs) suppresses the sampling frequency component in the output signal from the sampling circuit due to the "filling of the buckets" (fully charging the charge transfer device) on alternate phases of the two-phase power supply.

The sampling circuits, such as sampling circuit 18, are arranged so that the source-followers of each stage, such as transistor $20_2$ and transistor $20_3$ are biased to the non-conducting state when their respective gate electrodes are coupled to a "bucket" which is "full" (fully charged). Necessarily then, during each phase of every period of the two-phase power supply, one of the source-followers must be biased to the non-conducting state while the remaining source-follower is free to monitor analog information in the form of "emptied buckets" (proportionately discharged charge transfer devices). See U.S. Pat. No. 3,746,883, entitled "Charge Transfer Circuits".

Figure 2:
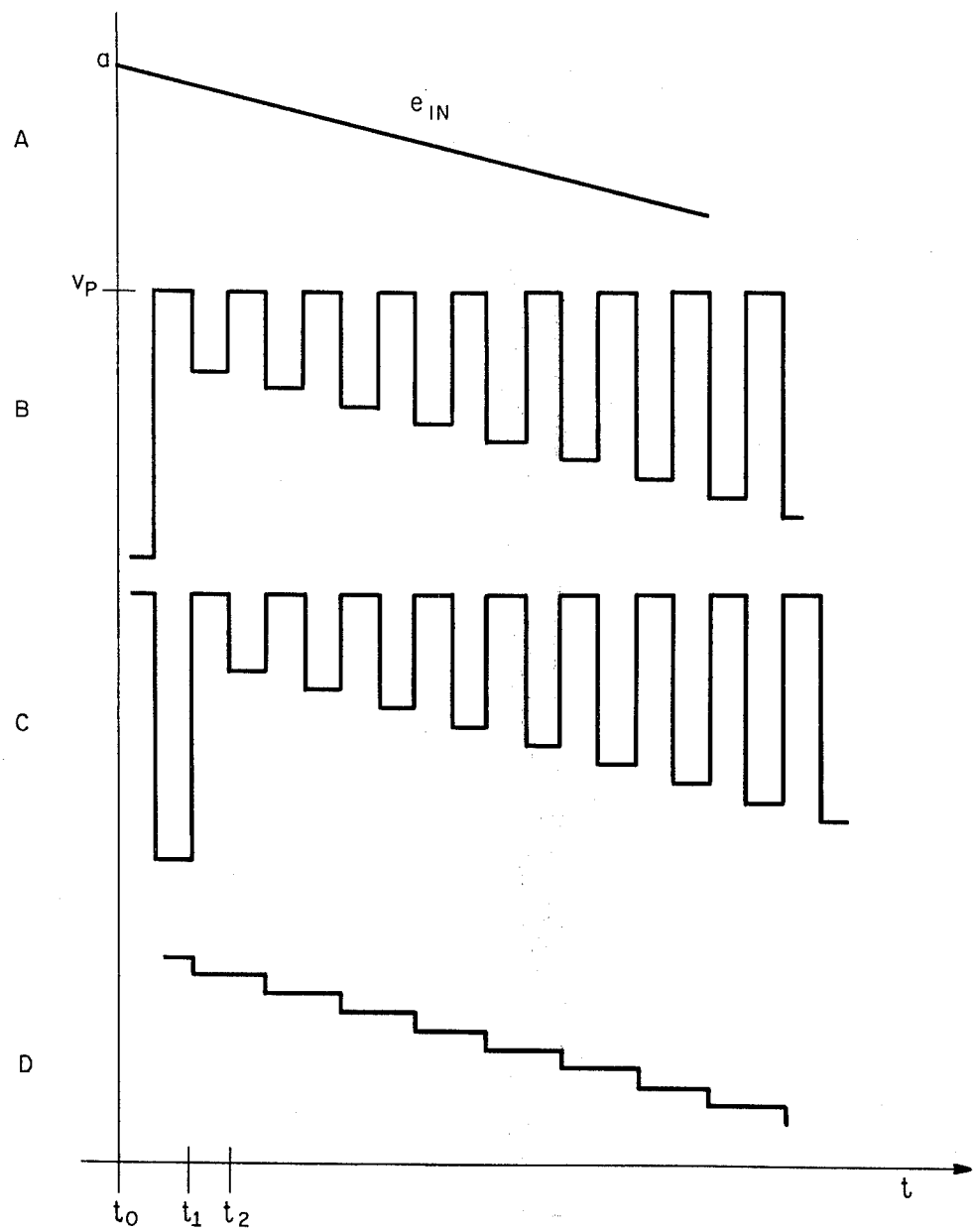
FIG. 2 is a graphic diagram comparing the output waveforms of a unitary-type source-follower or delay tap with the multiple source-follower arrangement of the present invention.

The filtering effect of sampling circuit 18 is graphically depicted in FIG. 2. In part A of FIG. 2, a portion of the input signal, applied to the input terminal $e_{in}$ of the BBDL 14, is displayed. If transistor $20_3$ were not utilized, then, part B of FIG. 2 would accurately depict the signal developed at the source electrode of transistor $20_2$ in response to the signal of part A after a delay of $t_1 - t_0$, where $t_1 - t_0$ is equal to 2.5 periods of the two-phase power supply. As indicated in the graph of part B, the signal level returns to the quiescent voltage level $V_Q$ for half of each period of the two-phase power supply due to the "filling of the bucket". If transistor $20_3$ is utilized exclusively in sampling circuit 18, then part C of FIG. 2 would accurately describe the output signal from the sampling circuit 18 in response to the input signal of part A delayed by a period of $t_2 - t_0$ where $t_2 - t_0$ is equal to 3.0 periods of the two-phase power supply. Similar to the output of the configuration of part B, the output of the configuration of part C also includes a component of the sampling frequency due to the "filling of the bucket". If transistors $20_2$ and $20_3$ are combined as shown in FIG. 1, the sampling frequency is suppressed and a more accurate and uniform output signal is generated from sampling circuit 18 as represented graphically in part D of FIG. 2.

The third device in each sampling circuit, transistor $20_1$ in this example, is a loading element for the source-follower transistors $20_2$ and $20_3$. Transistors are utilized as the loading elements in the sampling circuits as opposed to resistors or lumped elements because it is considerably more economical to manufacture a monolithic chip with the same type of device used throughout.

The output leads $32_1, 32_2 \ldots 32_{12}$ of the sampling circuits are coupled to the gate electrodes of the weighting amplifiers, transistors $33_1, 33_2 \ldots 33_p$ and $34_1, 34_2 \ldots 34_r$. The transconductance of each weighting amplifier is designed and fabricated in accordance with the Fourier Transform of the filtering function to be performed. For example, assuming that the transconductance of transistor $34_2$ has been weighted greater than that of transistor $34_1$ by a factor of 2, then, under the proper biasing conditions, identical input signals to the gate electrodes of transistors $34_1$ and $34_2$ will result in a drain current in transistor $34_2$ which will equal twice that for transistor $34_1$.

The weighting amplifiers are grouped together in two assemblies, according to polarity, by coupling together the drain electrodes of all positive polarity weighting amplifiers and similarly coupling the drain electrodes of all negative polarity weighting amplifiers. Transistors 38 and 39 act as loading elements for the positive polarity weighting amplifiers and the negative polarity weighting amplifiers, respectively. Transistor 37 is coupled to the source electrode of all weighting amplifiers and is constructed and biased so that it remains in the saturated mode at all times thereby approximating a constant current source.

The positive polarity bank of weighting amplifiers 35 in cooperation with transistor 38 are constructed and biased in a manner such that the entire combination operates in a linear mode. More particularly, for increases or decreases in the applied gate electrode signals to transistors $33_1, 33_2 \ldots 33_p$, the voltage potential on lead 44 linearly decreases or increases, respectively. Therefore, the gage voltage applied to the gate electrodes of the weighting amplifiers must be maintained within a specified range so that non-linearities in the voltage potential on lead 44 will not result. The negative polarity bank of weighting amplifiers 36 in cooperation with transistor 39 are similarly constructed and biased.

It is apparent that the voltage potential on leads 43 and 44 are indicative of the total inverse weighted summation of the input signals applied to the gate electrodes of their respective weighting amplifiers. However, because the source electrodes of all weighting amplifiers are coupled to a constant current source, there is an interaction between the two banks of amplifiers 35 and 36. For example, consider transistors $34_1$ and $34_2$ once again. An increase in the signal level $\Delta V_{sc}$ on output line $32_{11}$ induces an increase $\Delta I_{43}$ in the current flowing through lead 43 of the negative polarity bank of weighting amplifiers 36, where $\Delta I_{43}$ depends on the transconductance of transistor $34_2$. Accompanying the increase in current $\Delta I_{43}$ is a decrease $\Delta V_{43}$ in the voltage potential on lead 43. Since transistor 37 is constructed to act as a constant current source, there must occur a decrease $\Delta I_{44}$ in the current flowing through lead 44 equivalent in magnitude to $\Delta I_{43}$. A decrease $\Delta I_{44}$ in current necessarily results in an increase $\Delta V_{44}$ in the voltage potential on lead 44. If instead of an increase in the signal level on output lead $32_{11}$, there occured an identical increase $\Delta V_{sc}$ in the signal level on output lead $32_{12}$, the current flowing through lead 43 would increase by $(\Delta I_{43}/2)$.

This increase is equal to only one-half of the increase $\Delta I_{43}$ of the previous example because it is still assumed that the transconductance of transistor $34_2$ has been weighted greater than the transconductance for transistor $34_1$ by a factor of 2. If, the current in lead 43 has increased by $(\Delta I_{43}/2)$, the voltage potential on lead 43 must therefore decrease by a value of $(\Delta V_{43}/2)$. Similar to the previous example, the current through lead 44 must decrease by a value of $(\Delta I_{44}/2)$ forcing the voltage on lead 44 to increase by a value of $(\Delta V_{44}/2)$.

Accordingly, for any increase in signal levels to the gate electrodes of the positive polarity bank of weighting amplifiers 35, there will result a similar reaction on leads 43 and 44 as for that described in the previous two examples with the exception, however, that the voltage level on lead 44 will decrease while the voltage level on lead 43 will increase. Conversely, for decreases in the signal levels to the gate electrodes of the respective positive and negative polarity banks of weighting amplifiers, there will occur equal and opposite fluctuations in the voltage potential on leads 43 and 44. Therefore, the voltage potential on lead 44 (or lead 43) represents the aggregate, polarized, weighted summation of the analog information contained within the designated stages of the BBDL 14.

The voltage potential on lead 44 is monitored by a source-follower transistor 40 which in cooperation with a loading transistor 41 transmits to the output terminal $e_{out}$, a signal indicative of the voltage potential variations on lead 44. It is to be understood that the combination of transistors 40 and 41 and the output terminal $e_{out}$ may be coupled to lead 43 rather than lead 44 resulting in an output signal which is similar to that described for the configuration of FIG. 1 and 180° out-of-phase therewith.

An important factor, not mentioned heretofore, but which must be considered, is the signal deterioration which inherently occurs within the BBDL 14. In the operation of a conventional BBDL (and in the other types of charge transfer delay lines) there often results undesired shifts of the d.c. voltage level of the signal being propagated therethrough. Such shifts occur in each charge transfer device throughout the delay line. Two important reasons for the voltage shifts which occur in monolithic BBDLs are the reverse leakage currents across p-n junctions in the circuit and the phenomenon known as charge pumping.

The reverse leakage problem occurs in the following manner. During each phase of the two-phase power supply, analog information is transferred from one bucket to the succeeding bucket in the delay line. During a transfer, a quantity of charge $q_1$ leaks across the reversed biased junctions of the MOSFET device. Therefore, for this transfer, d.c. voltage level corresponding to the analog information, will be shifted by an amount $\Delta V$ where $\Delta V = q_1/C$ and C is the capacitance of each capacitor $16_1, 16_2 \ldots 16_{50}$ in the delay line. For BBDL's where p-channel MOSFETS are used, the d.c. voltage level shift will be in a positive direction whereas a negative polarity voltage level shift occurs for n-channel MOSFETS. During each succeeding transfer period, a further quantity of charge is lost to the substrate. Thus, if the clock frequency is sufficiently low for a given length of delay line, or if the delay line is sufficiently long for a given clock frequency, the cumulative voltage shift becomes equal to the input signal level of the analog information thereby resulting in the complete loss of the signal.

The charge pumping phenomenon is unique to MOSFET devices. Each time that a MOSFET device is rendered conductive the charge required to create the channel between the source and drain diffused regions is obtained primarily from the diffused drain-source regions. When the device is rendered non-conductive, a certain portion of discharge is lost to the substrate where it combines with the majority carriers. The effect of this charge pumping phenomenon is the pumping of positive charge (in the case of a p-channel device) from the drain or source regions into the substrate. This phenomenon causes the drain or source potential to shift in a negative polarity direction. (In the case of an n-channel device, the d.c. level shift is in a positive polarity direction). Thus, the level shifting that results from the charge pumping phenomena is in a direction opposite to that which results from a reverse leakage problem. Hence, charge pumping may be described as a charge gain phenomenon.

Although the effects of reverse leakage problem and the charge pumping phenomena tend to offset one another, in most applications, one of the two will be predominant. In low frequency applications, the reverse leakage effect predominates thereby causing the level-shift in a positive polarity direction for a p-channel device. In high frequency applications, the reverse leakage current effects may be negligible, and the charge pumping phenomena predominates to cause a net d.c. voltage level shift in a negative direction for the same p-channel device.

There are various methods which have been devised to error-compensate for the aforementioned voltage level shifts which are inherent in BBDL's. Some involve a more complex fabrication of the individual buckets contained in the BBDL whereas others provide external compensation means since, the net voltage level shift per bucket, may be predetermined for a given frequency range. See U.S. Pat. No. 3,819,954 entitled "Signal Level Shift Compensation in Charge-Transfer Delay Line Circuits", to Butler et al.

The present invention employs an external compensation means, but does so without adding additional components. As mentioned previously, the transconductance of each weighting amplifier $33_1, 33_2 \ldots 34_r$ and $34_1, 34_2 \ldots 34_r$ is varied in accordance with the Fourier Transform of the filtering function to be performed. In addition thereto, the transconductance of each weighting amplifier is adjusted to compensate for the inherent voltage level shifts in the BBDL 14. This method of compensation for the inherent voltage level shifts of the BBDL 14, provides a satisfactory method for error-compensating without requiring additional parts and without further complicating the fabrication of the monolithic chip.

Figure 3:
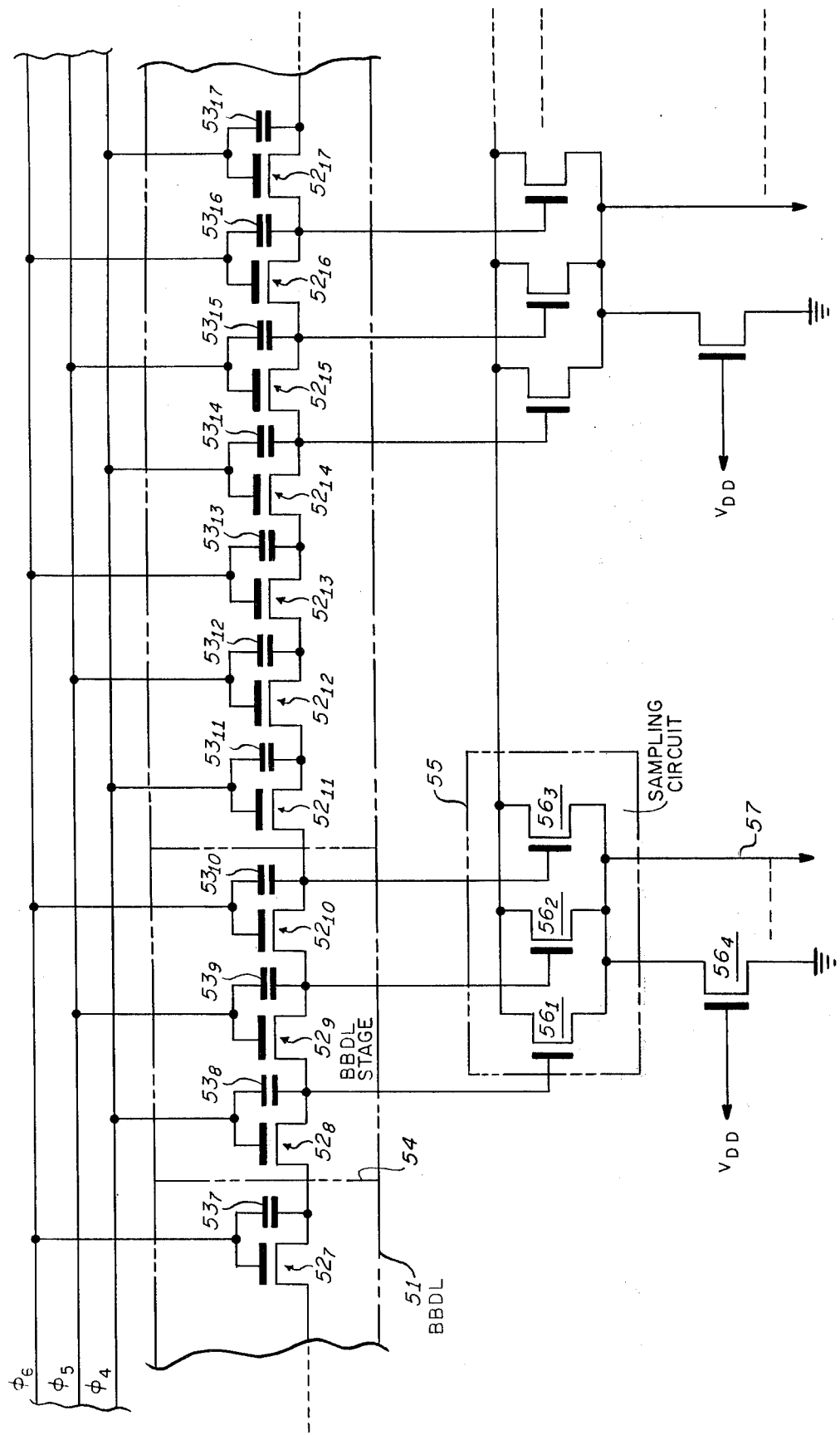
FIG. 3 is a schematic diagram depicting in part a variation of the invention of FIG. 1.

In some applications, it is desirable to use a multiphase power supply (usually three phase) as opposed to the two-phase supply described for the configuration of FIG. 1. FIG. 3 depicts, in part, such as a multi-phase configuration and in particular describes a three-phase operation. Part of the BBDL 51 is shown consisting of transistors $52_7, 52_8 \ldots 52_{17}$ and capacitors $53_7, 53_8 \ldots 53_{17}$. Each stage, such as stage 54 consists of three buckets as opposed to the two of the previous examples wherein the gate-capacitor junctions of the first, second and third buckets are connected to the first, second and third phases, respectively, of the three-phase power supply. For example, the junction of capacitor $53_8$ and the gate electrode of transistor $52_8$ is coupled to $\phi_4$. The operation of this BBDL 51 is identical to that of BBDL 14 with the exception that three phases of the power supply, each of which equals 120° of a period, is required for the analog information stored within one bucket of a stage to be transferred to the corresponding bucket in the following stage. Since each stage has three buckets therein, each sampling circuit, such as sampling circuit 55 requires three source-followers such as MOSFETS $56_1, 56_2$ and $56_3$ in addition to a loading transistor $56_4$. The operation of sampling circuit 55 is similar to that of sampling circuit 18 resulting in an output signal on the output 57 similar to that of sampling circuit 18. The remainder of the filter including the weighting amplifiers, loading elements, etc. is similar to the configuration of the circuit depicted in FIG. 1 and operates in identical fashion.

Thus far, the discussion has been limited to charge transfer devices which utilized BBDL's. The invention may incorporate a charge coupled circuit instead of a BBDL. When such a technique is used, however, a different method of tapping must be utilized since tap outputs, such as the junction of the drain electrode of MOSFET $15_1$ and capacitor $16_1$, are not readily available. Typically, the gate electrode current to the charge transfer devices is monitored to determine the signal level present at each bucket. A circuit, analogous to sampling circuit 18 may be added to eliminate the serrations due to the two-phase power supply. The output of the same would then be coupled to a group of weighting amplifiers, etc. identical to those depicted in FIG. 1.

The filter may also be adapted to monitor a plurality of photo-sensitive elements, usually photo-diodes, as opposed to the application of an input signal at an input terminal $e_{in}$. Further, it is to be understood also that the filter is not limited to the number of charge transfer elements, sampling circuits and weighting amplifiers chosen for the purposes of this discussion but may encompass more or less. The limiting factors here are the availability of chip space and the inherent signal deterioration in the charge transfer delay line previously discussed.

It can be appreciated therefore that the invention embodies a monolithic transversal filter employing charge transfer techniques. A conventional delay line is tapped by a plurality of sampling circuits which suppress the sampling frequency, due to the multi-phase power supply, from the analog signal. The outputs from the sampling circuits are coupled to a plurality of weighting amplifiers each consisting of a single MOSFET device. Each weighting amplifier is uniquely fabricated and disposed so that the output signals of the respective sampling circuits are proportionately weighted, polarized, error-compensated and differentially summed in a single operation.

While the invention has been described in its preferred embodiment, it is to be understood that the words which have been used are words of description rather than limitation and that changes may be made within the purview of the appended claims without departing from the true scope and spirit of the invention in its broader aspects.

We claim:
1. A monolithic transversal filter comprising:
 a plurality of charge transfer means coupled together to form a charge transfer delay line for sequentially transferring analog information in the form of electrical signals;
 a plurality of sampling means coupled to selected charge transfer means for sensing said electrical signals therein;
 a plurality of amplifier means, each having an output, an input individually coupled to one of said sampling means, and an amplification characteristic which may be variable fabricated to yield at the output of said amplifier means a signal indicative of the sensed electrical signal amplified by a desired factor and compensated with respect to errors therein occurring within said charge transfer delay line and wherein said plurality of amplifier means are arranged in first and second groups for polarizing the outputs of said amplifier means such that the outputs of the amplifier means comprising said first group are coupled to a first common output and the outputs of the amplifier means comprising said second group are coupled to a second com- mon output; and circuit means coupled to said plurality of amplifier means and cooperating therewith for providing a differential summation of the output signals from said amplifier means such that the signal on either said first or second common output represents the polarized summation of the error-compensated, amplified electrical signals sensed by said sampling means in said selected charge transfer means.

2. The monolithic transversal filter as set forth in claim 1 wherein each amplifier means is comprised of a MOSFET with the gate electrode thereof coupled to a sampling means.

3. The monolithic transversal filter as set forth in claim 2 wherein said characteristic which may be variable fabricated is comprised of the transconductance of said MOSFET.

4. The monolithic transversal filter as set forth in claim 1 wherein said circuit means is comprised of:
first loading means coupled to said first common output,
second loading means coupled to said second common output, and
constant source means coupled to each amplifier means, such that any change in the electrical signal level on said first common output is inversely reflected in the electrical signal level on said second common output and similarly a change in the electrical signal level on said second common output is inversely reflected in the electrical signal level on said first common output.

5. The monolithic transversal filter as set forth in claim 4 wherein the arrangement of said amplifier means to provide polarization includes the connection of the source electrode of each amplifier means to said constant source means, the connection of the drain electrode of each amplifier means comprising said first group to said first common output and the connection of the drain electrode of each amplifier means comprising said second group to said second common output.

6. The monolithic transversal filter as set forth in claim 5 wherein:
said first loading means is comprised of a single MOSFET appropriately fabricated and coupled to said first common output,
said second loading means is comprised of a single MOSFET appropriately fabricated and coupled to said second common output,
said constant source means is comprised of a single MOSFET appropriately fabricated to act as a constant current source and coupled to the source electrodes of each amplifier means.

7. The monolithic transversal filter as set forth in claim 4 wherein each and every means comprising said apparatus monolithic transversal filter consists of a MOSFET.

8. A monolithic transversal filter comprising:
charge transfer delay line means comprising a plurality of charge transfer means connected in series between an input and a precharger source and disposed in states of X charge transfer means per stage where X is an integer greater than 1, said delay line means further comprising an X-phase power supply wherein each phase of said power supply is coupled respectively to the X charge transfer means of each stage whereby for X phases of said X-phase power supply, information applied to the input of said charge transfer delay line means and stored as charge signal in a charge transfer means is transferred to the corresponding charge transfer means of the next adjacent stage, a plurality of sampling circuit means each comprising an output and X inputs, wherein said X inputs are coupled respectively to the X charge transfer means of preselected stages of said charge transfer delay line means, and wherein the information stored in the X charge transfer means of the preselected stages is sampled respectively for the X phases of each period of said X power supply, and in response thereto, output signals are generated at the outputs of said sampling circuit means indicative of the information stored within the X charge transfer means of the preselected stages and in which the sampling frequency is substantially suppressed, a plurality of amplifier means, each amplifier means comprising a single MOSFET and disposed in a first or second group according to polarity, wherein the gate electrode of each MOSFET is individually coupled to the output of a sampling circuit means and wherein the transconductance of each amplifier means is fabricated in accordance with a predetermined amplification and error-compensation factor;

first loading means, comprising an appropriately constructed MOSFET and coupled to the drain electrodes of the amplifier means comprising said first group, second loading means, comprising an appropriately constructed MOSFET, and coupled to the drain electrodes of the amplifier means comprising said second group, constant current source means comprising an appropriately constructed MOSFET coupled to the source electrodes of each amplifier means whereby the output signals of said sampling circuit means are proportionately amplified, error-compensating, polarized and differentially summed and wherein the signal developed at the drain electrodes of the amplifier means comprising said first group or said second group is indicative of said proportionately amplified, error-compensated, polarized summation of said analog information.

* * * * *